(12) United States Patent
Chen et al.

(10) Patent No.: US 12,550,335 B2
(45) Date of Patent: Feb. 10, 2026

(54) FERROELECTRIC TUNNEL JUNCTION (FTJ) STRUCTURES

(71) Applicant: Taiwan Semiconductor Manufacturing Company, Ltd., Hsinchu (TW)

(72) Inventors: Kuen-Yi Chen, Hsinchu (TW); Yu-Sheng Chen, Taoyuan (TW); Yi Ching Ong, Hsinchu (TW); Kuo-Ching Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 662 days.

(21) Appl. No.: 17/819,244

(22) Filed: Aug. 11, 2022

(65) Prior Publication Data

US 2024/0057343 A1 Feb. 15, 2024

(51) Int. Cl.
| | |
|---|---|
| H10B 53/30 | (2023.01) |
| H10B 51/20 | (2023.01) |
| H10B 51/30 | (2023.01) |
| H10B 53/10 | (2023.01) |
| H10B 53/20 | (2023.01) |
| H10B 61/00 | (2023.01) |

(52) U.S. Cl.
CPC ............ H10B 53/30 (2023.02); H10B 51/20 (2023.02); H10B 51/30 (2023.02); H10B 53/10 (2023.02); H10B 53/20 (2023.02); H10B 61/22 (2023.02)

(58) Field of Classification Search
CPC ........ H10B 51/10; H10B 51/20; H10B 51/30; H10B 53/10; H10B 53/20; H10B 53/30; H10B 61/00; H10B 61/22
See application file for complete search history.

(56) References Cited

U.S. PATENT DOCUMENTS 12,127,483 B2 * 10/2024 Lee .................. H10N 50/10
2018/0331113 A1 * 11/2018 Liao ................. H10B 53/40

FOREIGN PATENT DOCUMENTS

CN 113421885 A * 9/2021 ............ H01L 28/55
WO WO-2021112247 A1 * 6/2021 ............ G11C 11/22

* cited by examiner

*Primary Examiner* — Matthew E Warren
(74) *Attorney, Agent, or Firm* — Ingrassia Fisher & Lorenz, LLP (57) ABSTRACT

Provided are ferroelectric tunnel junction (FTJ) structures, memory devices, and methods for fabricating such structures and devices. An FTJ structure includes a first electrode, a ferroelectric material layer, and a catalytic metal layer in contact with the ferroelectric material layer.

20 Claims, 9 Drawing Sheets

FERROELECTRIC TUNNEL JUNCTION (FTJ) STRUCTURES

BACKGROUND

Two types of memories, volatile memory and non-volatile memory, are widely used in electronic products. Volatile memory loses the data stored in the memory when the power is lost, while non-volatile memory keeps the data stored in the memory when there is no power.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, in certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Embodiments provided herein provide for forming a ferroelectric tunnel junction (FTJ) device at back end of line (BEOL) processing with an ultra thin ferroelectric thin film. Processing that embeds FTJ devices in CMOS BEOL may constrain the thermal energy that is needed to crystallize the ferroelectric material of the FTJ device. Typically a higher thermal annealing temperature is needed for thinner ferroelectric films. Therefore, ferroelectric films may be limited to a thickness of 5 nanometers (nm) in order to have an annealing temperature of less than 450° C. for crystallization.

Embodiments herein make use of a catalytic metal to decrease the crystallization temperature of the ferroelectric thin film. Higher crystallization temperatures negatively affect other BEOL devices, therefore, a decrease in the crystallization temperature provides a larger process window. Also, embodiments herein provide for a cost reduction in processing. Also, the FTJ memory cell may be provided with increased sensing current.

Figure 1:
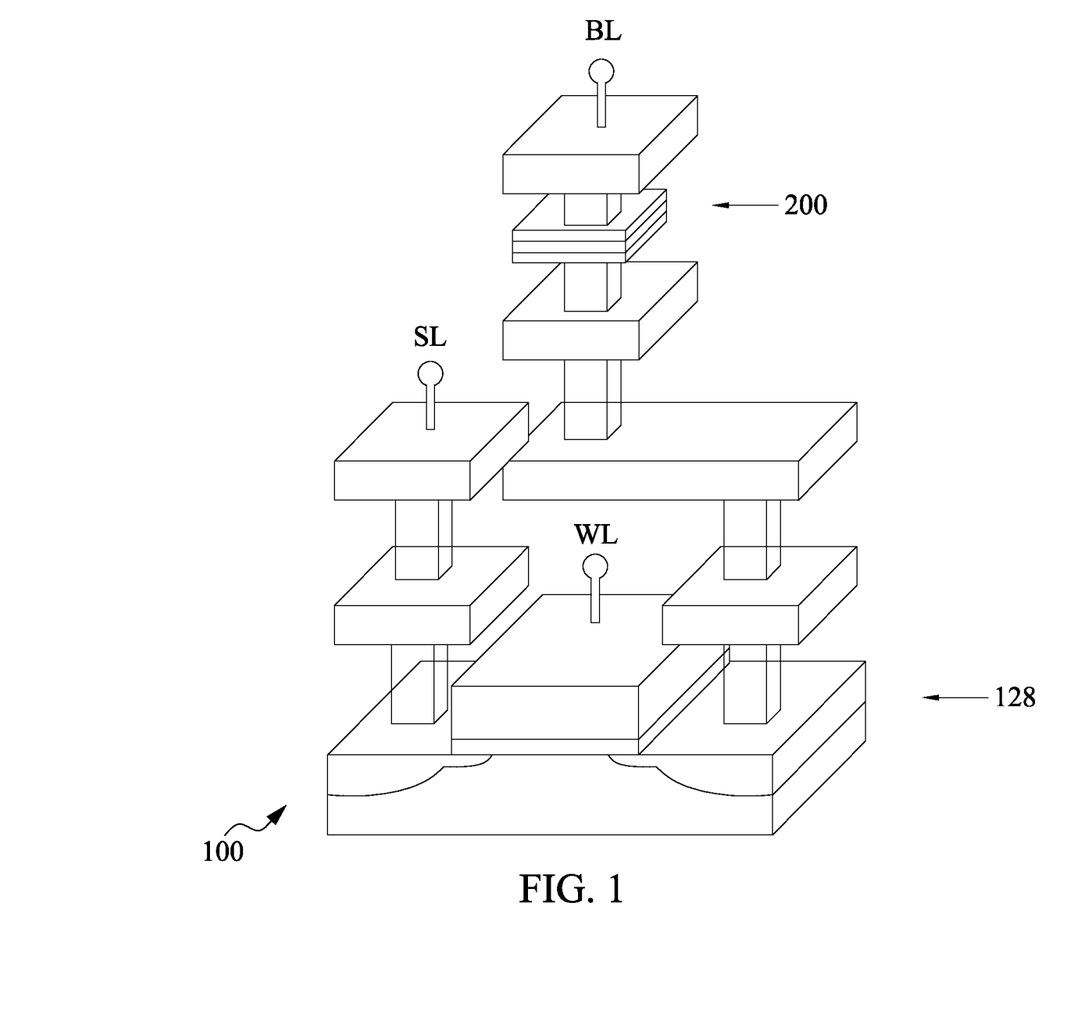
FIG. 1 is a perspective view of a device including a transistor and an FTJ structure, in accordance with some embodiments.

FIG. 1 is a perspective view of an example of a semiconductor structure 100 according to some embodiments. In FIG. 1, structure 100 includes a memory cell 200 electrically connected to device 128. As shown, a bit line (BL), select line (SL), and write line (WL) are electrically connected to the structure 100 for signal communication as desired.

Figure 2:
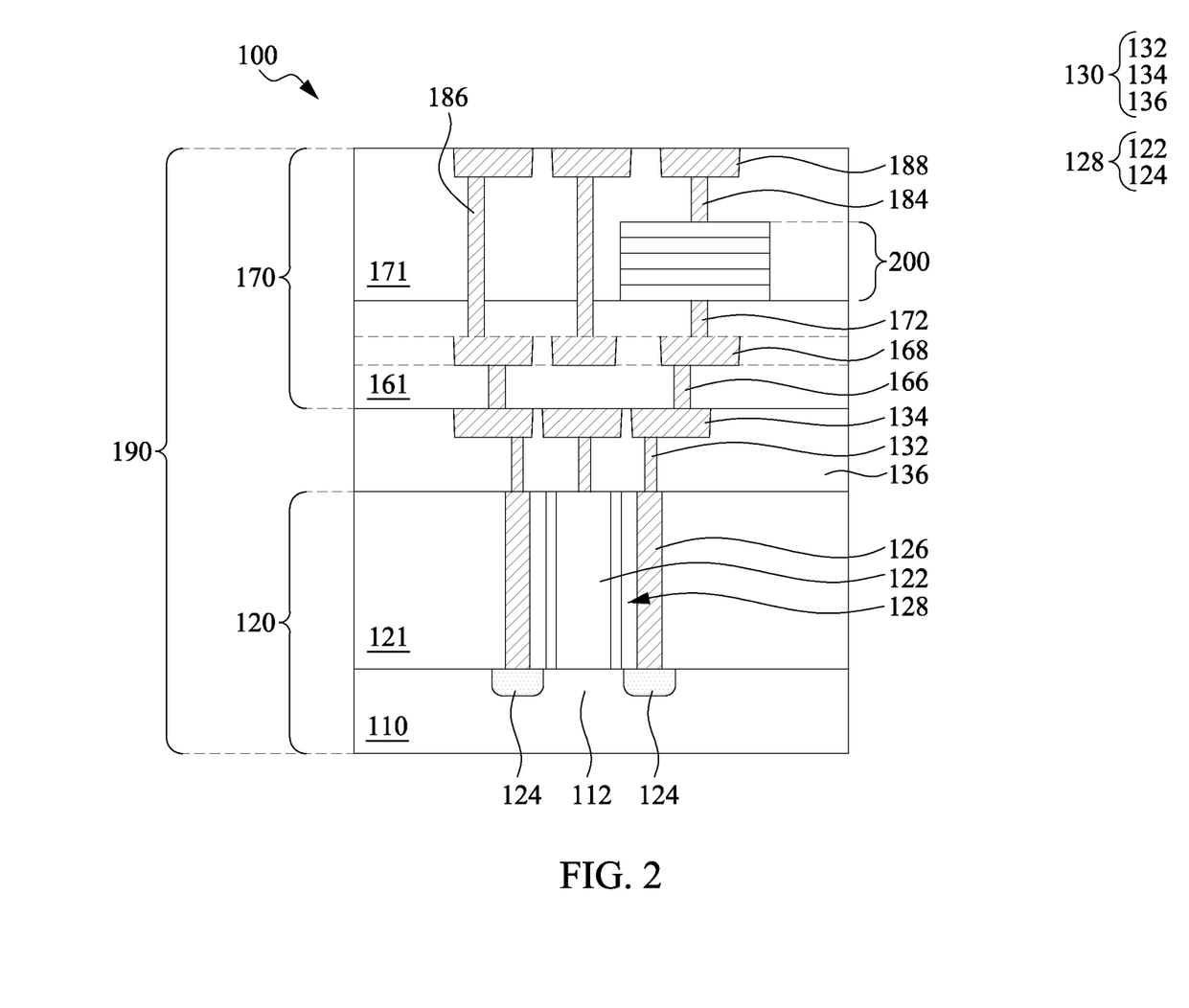
FIG. 2 is a cross sectional view of a device including a transistor and an FTJ structure, in accordance with some embodiments.

Referring to FIG. 2, a cross sectional view of a semiconductor structure 100 like that of FIG. 1 is provided. As shown, the semiconductor structure 100 includes a substrate 110, a transistor device layer 120, an interconnection structure 130, and a memory layer 170. Specifically, as shown in FIG. 1, the device layer 120 disposed on the substrate 110 includes semiconductor devices 128 formed therein. In some embodiments, the substrate 110 includes a semiconductor substrate. In one embodiment, the substrate 110 comprises a crystalline silicon substrate or a doped semiconductor substrate (e.g., p-type semiconductor substrate or n-type semiconductor substrate). In some alternative embodiments, the substrate 110 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

As shown in FIG. 2, the device layer 120 includes semiconductor devices 128 such as metal-oxide-semiconductor field effect transistors (MOSFETs) embedded in a dielectric layer 121 on the substrate 110. In some embodiments, the MOSFETs include NMOS and PMOS formed following the complementary MOS (CMOS) processes. In certain embodiments, the semiconductor devices 128 are formed by the front-end-of-line (FEOL) processes and may be considered as FEOL devices. In some embodiments, the semiconductor device 128 includes a gate structure 122 located on the substrate 110, source and drain regions 124 formed as doped regions in the substrate 110 and a channel region 112 between the source and drain regions 124. In some embodiments, the device layer 120 further includes, but is not limited thereto, other types of transistors, capacitors, resistors, or the like. The semiconductor devices 128 in the device layer 120 are electrically connected with the above interconnection structure 130. In some embodiments, the interconnection structure 130 includes conductive lines 134 and conductive vias 132 embedded in an insulating layer 136 for interconnecting the semiconductor devices 128 and for electrically connecting the semiconductor devices 128 with other above layers. In some embodiments, the conductive vias 132 electrically connects to the gate structure 122 directly. In some embodiments, the conductive vias 132 electrically connects to the source and drain regions 124 through the conductive vias 126 in the device layer 120.

Although only one transistor device 128 is shown in FIG. 1, it is well understood that multiple tiers or layers of transistor layer may be formed and more transistors may be included in the transistor layer.

In some embodiments, a dielectric structure (not shown) may be formed over and disposed on the interconnection structure 130 and the device layer 120. Such a dielectric structure may include multiple dielectric layers and further metallization layers or conductive patterns may be embedded in the dielectric structure for electrically connecting the underlying semiconductor devices 128 with the structure(s) located in the above layers.

As shown in FIG. 2, the memory layer 170 is formed over and disposed on the interconnection structure 130. In exemplary embodiments, the memory layer 170 includes a memory cell 200 electrically connected to one of source and drain regions 124 of the device 128. In exemplary embodiments, the memory cell 200 includes a ferroelectric tunnel junction (FTJ) structure. The FTJ structure is a tunnel junction in which two electrodes are separated by a thin ferroelectric layer. The spontaneous polarization of the ferroelectric layer can be switched by an applied electric field. The electrical resistance of an FTJ strongly depends on the orientation of the electric polarization. When the FTJ is coupled with the device 128, device 128 may provide a larger $I_{on}$ to the FTJ to switch the resistance state of the FTJ by switching the polarization of the ferroelectric layer of the FTJ, and the memory performance is enhanced.

Thus, in some embodiments, one of the source and drain regions 124 of the device 128 is electrically connected with the memory cell 200 through conductive vias 132, conductive lines 134, conductive vias 166, conductive lines 168, and conductive via 172. The other one of the source and drain regions 124 of the device 128 is electrically connected with the conductive lines 188 through the conductive vias 166, conductive lines 168, and conductive via 186, and the memory cell 200 is electrically connected with the conductive lines 188 through the conductive via 184. As shown in FIG. 2, the conductive vias 166, 172, 184, 186, and the conductive lines 168, 188 are part of the metallization structures of the memory layer 170. In some embodiments, the device 128 in the device layer 120 and the memory cell 200 in the memory layer 170 form a memory device 190.

A ferroelectric random-access memory (FeRAM) includes a transistor and a ferroelectric tunnel junction (FTJ) structure. FeRAM stores information using the spontaneous polarization of the ferroelectric material. In certain embodiments, the memory cell 200 includes an FTJ structure, the transistor 120 and the memory cell 200 (e.g. FTJ) together form a memory device 190 (i.e. FeRAM device).

Figure 3:
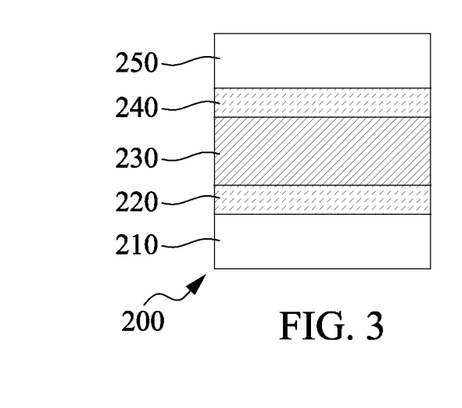
FIG. 3 is a cross sectional view of an FTJ structure, in accordance with some embodiments.

FIG. 3 is a schematic cross-sectional view of an embodiment of the memory cell 200 of FIGS. 1 and 2. In FIG. 3, memory cell 200 is an FTJ structure.

As shown, memory cell 200 includes a bottom electrode 210. An exemplary bottom electrode 210 is a conductive electrode. For example, an exemplary bottom electrode is formed from pure metal, refractory metal nitrides, or conductive oxides.

As further shown, memory cell 200 includes a catalytic metal layer 220. An exemplary catalytic metal layer 220 is formed from catalytic metal such as a low electronegativity metal. As used herein, a "low electronegativity metal" has an electronegativity of less than or equal to, i.e., no more than, 1.8. Thus, appropriate materials may include tungsten (with an electronegativity of 1.7), molybdenum (1.8), tantalum (1.5), hafnium (1.3), and other suitable low negativity metals.

In FIG. 3, memory cell 200 further includes a ferroelectric material layer 230. Ferroelectric material layer 230 may also be referred to as a polar oxide layer. An exemplary ferroelectric material layer 230 comprises ferroelectric material such as in the form of a perovskite, rutile or orthorhombic thin film. In some embodiments, the material of the ferroelectric material layer 230 includes a polar oxide material such as $HfO_2$, $HfZrO_2$, or $HfO_2$ doped with silicon, germanium (Ge), lanthanum (La), aluminum (Al), yttrium (Y), strontium (Sr) or zirconium (Zr) or the combinations thereof. In some embodiments, the material of the ferroelectric layer 230 includes lead zirconate titanate (PZT), aluminum nitride (AlN) or aluminum scandium nitride (AlScN).

In exemplary embodiments, the ferroelectric material layer 230 has a thickness of less than or equal to, i.e., no more than 4 nanometers (nm).

In the illustrated embodiment, memory cell 200 also includes a tunneling dielectric layer 240. Tunneling dielectric layer 240 may be referred to as the interfacial layer. Tunneling dielectric layer 240 may also be referred to as a non-polar dielectric oxide layer. In exemplary embodiments, the tunneling dielectric layer 240 has a dielectric constant of greater than 3. For example, the tunneling dielectric layer 240 may comprise a non-polar oxide such as $SiO_2$, $Al_2O_3$, $TiO_2$, $Ta_2O_5$, TaON, or other suitable non-polar dielectric oxides. In exemplary embodiments, the tunneling dielectric layer 240 has a thickness of less than 2 nanometers (nm).

As further shown, memory cell 200 further includes a top electrode 250. An exemplary top electrode 250 is a conductive electrode. For example, an exemplary top electrode 250 is formed from pure metal, refractory metal nitrides, or conductive oxides. It is noted that the top electrode 250 and the bottom electrode 210 may be the same material or may be different materials.

Cross-referencing FIGS. 2 and 3, it may be seen that bottom electrode 210 is electrically connected to the conductive via 172 and top electrode 250 is electrically connected to the conductive via 184.

In the illustrated embodiment of FIG. 3, the catalytic metal 220 is in direct contact with the ferroelectric material layer 230. Specifically, the ferroelectric material layer 230 is shown to be lying directly on a top surface of the catalytic metal 220 such that the catalytic metal 220 is located between the ferroelectric material layer 230 and the bottom electrode 210.

Other configurations are envisioned. For example, the catalytic metal 220 may lie directly on a top surface of the ferroelectric material layer 230 such that the ferroelectric material layer 230 is located between the catalytic metal 220 and the bottom electrode 210.

Contact between the catalytic metal 220 and the ferroelectric material layer 230 allows for metal-induced crystallization of the ferroelectric material layer 230. Further, the catalytic metal 220 decreases the crystallization temperature of the ferroelectric material layer 230.

Figure 4:
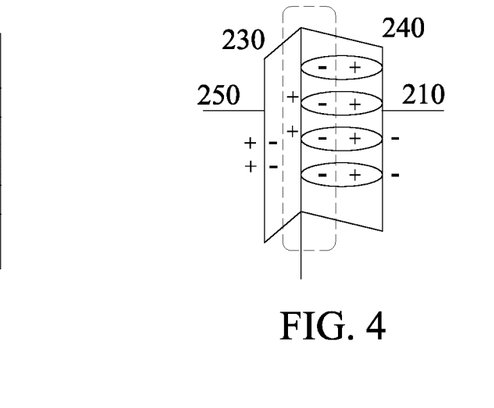
FIG. 4 is a schematic illustrating behavior of the FTJ memory cell of FIG. 3, in accordance with some embodiments.

FIG. 4 is a schematic illustrating the imperfect ±Pr screening of the FTJ structure 200, having a metal electrode 250, interfacial layer 240, ferroelectric layer 230, and metal electrode 210. The magnitude of polarization at E=0 is called remanent polarization (Pr). The role of the interfacial layer 240 in such an arrangement is to create the "0" and "1" difference by polarization-modulated barrier shape. As shown, the net charge is not equal to zero, the E-field ($E_{bi}$) is not equal to zero, and band bending occurs.

Figure 5:
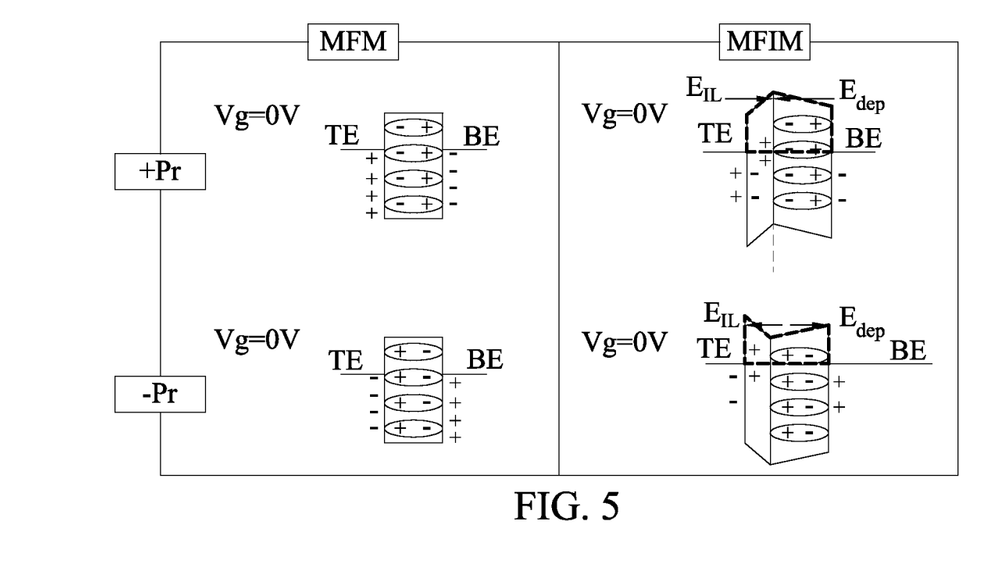
FIG. 5 is a schematic comparing behavior of the FTJ memory cell of FIG. 3 to a device lacking an interfacial layer.

FIG. 5 illustrates a difference in behavior between FTJ structures lacking an interfacial layer (on the lefthand side of the figure) and exemplary FTJ structures including an interfacial layer (on the righthand side of the figure), at a positive remanent polarization (+Pr) and at a negative remanent polarization (−Pr).

At a positive remanent polarization (+Pr), for the exemplary FTJ structures including an interfacial layer, there is a negative electric field in the ferroelectric ($E_{FE}$), there is an effective barrier height (BH) increase, and the device is put in a high-resistance state (HRS).

At a negative remanent polarization (−Pr), for the exemplary FTJ structures including an interfacial layer, there is a positive electric field in the ferroelectric ($E_{FE}$), there is an effective barrier height (BH) decrease, and the device is put in a low-resistance state (LRS).

Figure 6:
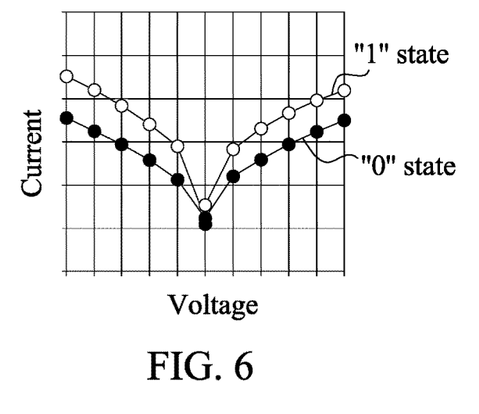
FIG. 6 is an I-V graph of a FTJ structure, in accordance with some embodiments.

FIG. 6 is an I-V measurement of an exemplary FTJ device showing formless, repeatable, voltage-dependent bipolar switching.

Figure 7:
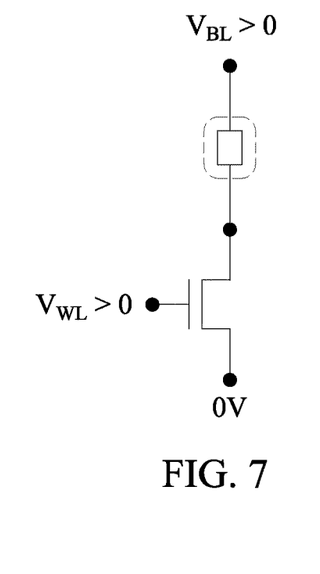
FIGS. 7 and 8 are circuit diagrams illustrated performance of a FTJ structure, in accordance with some embodiments.
Figure 8:
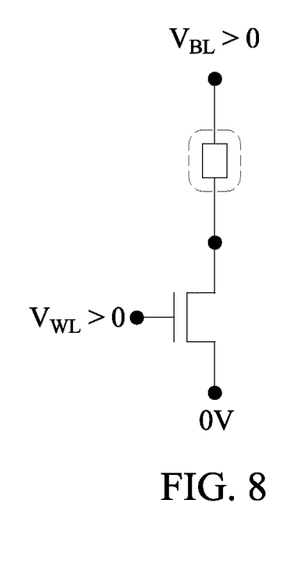

FIGS. 7 and 8 are circuit diagrams of the FTJ device 200. In FIG. 7, with a negative remanent polarization (−Pr), a bit line voltage ($V_{BL}$) of greater than zero, and a write line voltage ($V_{WL}$) of greater than zero, there is a smaller tunneling barrier, low resistance, and a large read current ($I_R1$).

In FIG. 8, with a positive remanent polarization (+Pr), a bit line voltage ($V_{BL}$) of greater than zero, and a write line voltage ($V_{WL}$) of greater than zero, there is a larger tunneling barrier, high resistance, and a small read current ($I_R0$).

Figure 9:
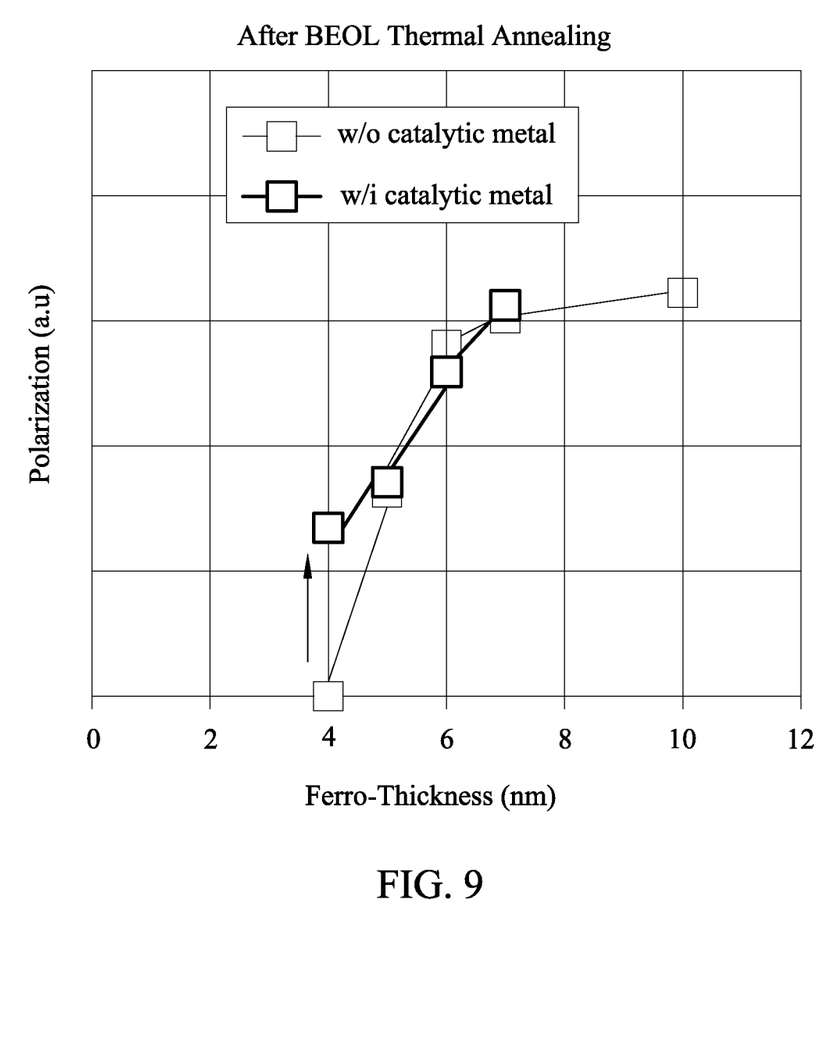
FIG. 9 is a graph illustrating the polarization of the ferroelectric material (y-axis) based on the thickness of the ferroelectric material (X-axis) for ferroelectric material with and without catalytic metal.

FIG. 9 is a graph illustrating the polarization of the ferroelectric material (y-axis) based on the thickness of the ferroelectric material (X-axis) for ferroelectric material without catalytic metal and for ferroelectric material with catalytic material. As shown, there is a significant increase in polarization at the 4 nanometer (nm) thickness when the ferroelectric material is contacted with the catalytic metal.

Figure 10:
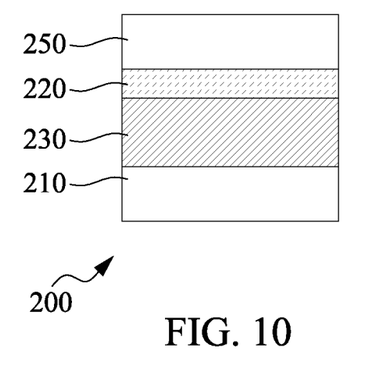
FIG. 10 is a cross sectional view of an FTJ structure, in accordance with some embodiments.
Figure 11:
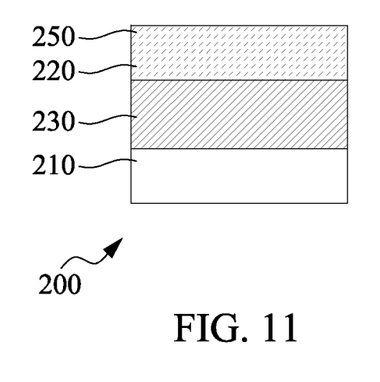
FIG. 11 is a cross sectional view of an FTJ structure, in accordance with some embodiments.

FIGS. 3-9 have discussed embodiments including two conductive electrodes. Referring now to FIGS. 10-11, embodiments including a semiconducting electrode are illustrated.

In FIG. 10, a FTJ memory cell 200 includes a bottom electrode 210. An exemplary bottom electrode 210 is a semiconducting electrode. For example, the bottom electrode 210 may comprise amorphous, poly or single crystalline such as Si, SiGe, Ge, GeSn, or other suitable semiconducting material.

As shown, memory cell 200 further includes a ferroelectric material layer 230. Ferroelectric material layer 230 may also be referred to as a polar oxide layer. An exemplary ferroelectric material layer 230 comprises ferroelectric material such as in the form of a perovskite, rutile or orthorhombic thin film. In exemplary embodiments, the ferroelectric material layer 230 has a thickness of less than or equal to, i.e., no more than 4 nanometers (nm).

As further shown, memory cell 200 includes a catalytic metal layer 220. An exemplary catalytic metal layer 220 is formed from catalytic metal such as a low electronegativity metal, i.e., having an electronegativity of less than or equal to, i.e., no more than, 1.8. Thus, appropriate materials may include tungsten (with an electronegativity of 1.7), molybdenum (1.8), tantalum (1.5), hafnium (1.3), and other suitable low negativity metals.

As further shown in FIG. 10, memory cell 200 further includes a top electrode 250. An exemplary top electrode 250 is a conductive electrode. For example, an exemplary top electrode 250 is formed from pure metal, refractory metal nitrides, or conductive oxides.

FIG. 11 illustrates another embodiment including a semiconducting electrode.

As shown in FIG. 11, FTJ memory cell 200 includes a bottom electrode 210. An exemplary bottom electrode 210 is a semiconducting electrode. For example, the bottom electrode 210 may comprise amorphous, poly or single crystalline such as Si, SiGe, Ge, GeSn, or other suitable semiconducting material.

As shown, memory cell 200 further includes a ferroelectric material layer 230. Ferroelectric material layer 230 may also be referred to as a polar oxide layer. An exemplary ferroelectric material layer 230 comprises ferroelectric material such as in the form of a perovskite, rutile or orthorhombic thin film. In exemplary embodiments, the ferroelectric material layer 230 has a thickness of less than or equal to, i.e., no more than 4 nanometers (nm).

As further shown, memory cell 200 includes a catalytic metal layer 220. An exemplary catalytic metal layer 220 is formed from catalytic metal such as a low electronegativity metal, i.e., having an electronegativity of less than or equal to, i.e., no more than, 1.8. Thus, appropriate materials may include tungsten (with an electronegativity of 1.7), molybdenum (1.8), tantalum (1.5), hafnium (1.3), and other suitable low negativity metals.

In the embodiment of FIG. 11, the catalytic metal layer 220 serves as the top electrode 250. Thus, no additional conductive layer is formed over the catalytic metal layer 220. In the embodiment of FIG. 11, the catalytic metal layer 220 may be formed with an increased thickness as compared to embodiments in which the catalytic metal layer 220 is not serving as an electrode.

It is noted that in the embodiments of FIGS. 10 and 11, no interfacial layer in the form of a tunneling dielectric or non-polar dielectric oxide layer is provided. In other words, there is no dedicated interfacial layer. Rather, the semiconducting electrode 210 serves as a combined electrode and interfacial layer.

Figure 12:
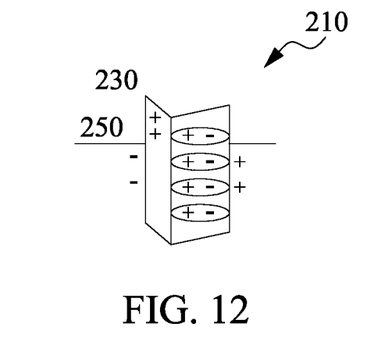
FIG. 12 is a schematic illustrating the interfacial layer limited transport exhibited by the FTJ memory cells of FIGS. 10 and 11.

FIG. 12 illustrates the interfacial layer limited transport exhibited by the FTJ memory cells of FIGS. 10 and 11, in which the FTJ structure 200, has a metal electrode 250, ferroelectric layer 230, and semiconducting electrode 210, which also serves as the interfacial layer.

Figure 13:
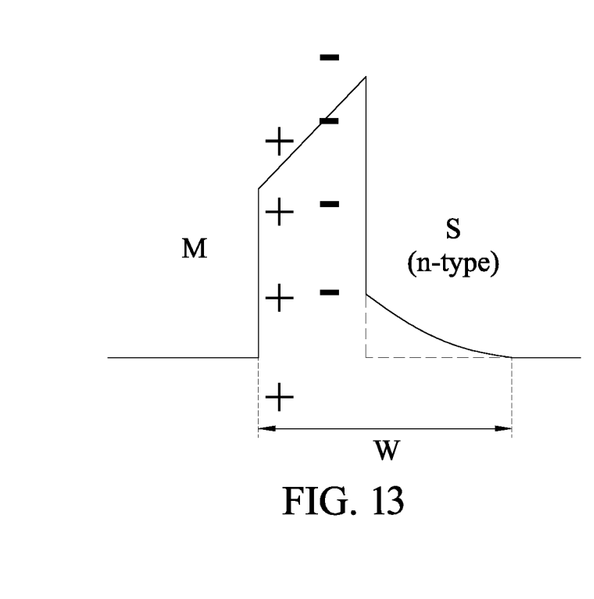
FIG. 13 is a band diagram for a depletion/inversion operation, in accordance with some embodiments.

FIG. 13 is a band diagram for a depletion/inversion operation at a negative remanent polarization (−Pr) wherein the device 200 of FIGS. 10 and 11 is in a high-resistance state (HRS). As shown, there is a large tunneling width (W).

Figure 14:
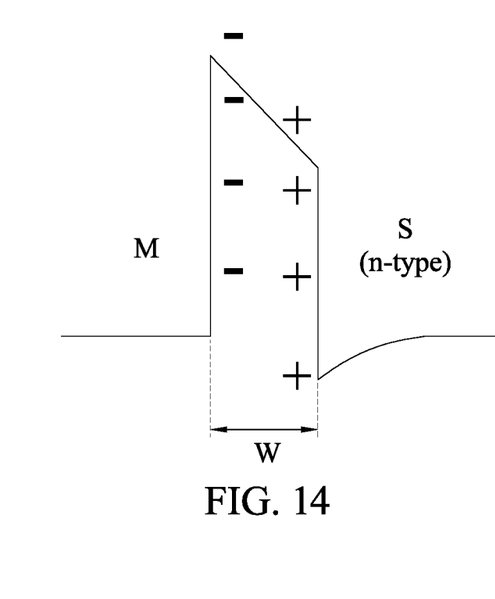
FIG. 14 is a band diagram for an accumulation operation, in accordance with some embodiments.

FIG. 14 is a band diagram for an accumulation operation at a positive remanent polarization (+Pr) wherein the device 200 of FIGS. 10 and 11 is in a low-resistance state (LRS). As shown, there is a short tunneling width (W).

Thus, it may be seen that the catalytic metal-ferroelectric-semiconductor electrode embodiments of FIGS. 10 and 11 may increase tunneling current by combining the electrode and the interfacial layer in the form of the semiconducting electrode.

FIGS. 15-18 illustrate devices 100 with three-dimensional (3D) catalytic-FTJ structures that provide for increasing tunneling current by enlarging the effective area of the structure.

Figure 15:
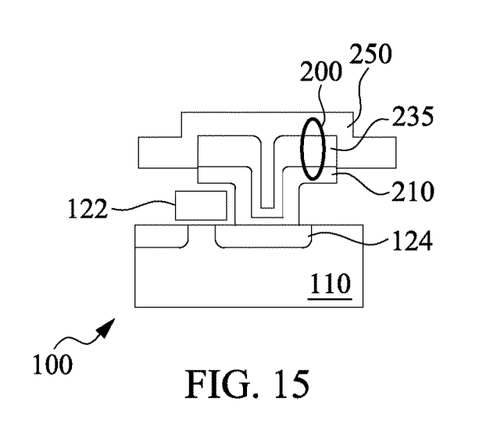
FIGS. 15-18 are cross-sectional schematic views illustrating three-dimensional (3D) catalytic-FTJ structures, in accordance with some embodiments.

Specifically, FIG. 15 illustrates a trench type structure connected to a source/drain region 124 adjacent to a gate 122 and over a substrate 110 with an FTJ structure 200 including a semiconducting or conductive electrode 210, a switching barrier that includes an interfacial layer and a ferroelectric material layer (collectively illustrated and identified by reference number 235), and a composite electrode 250.

Figure 16:
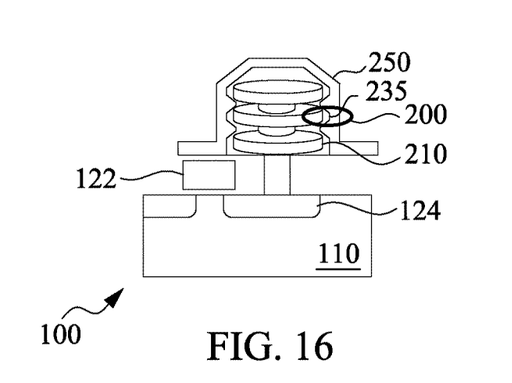

FIG. 16 illustrates a multi-fin type structure connected to a source/drain region 124 adjacent to a gate 122 and over a substrate 110 with an FTJ structure 200 including a semiconducting or conductive electrode 210, an interfacial layer and a ferroelectric material layer (collectively illustrated and identified by reference number 235), and a composite electrode 250.

Figure 17:
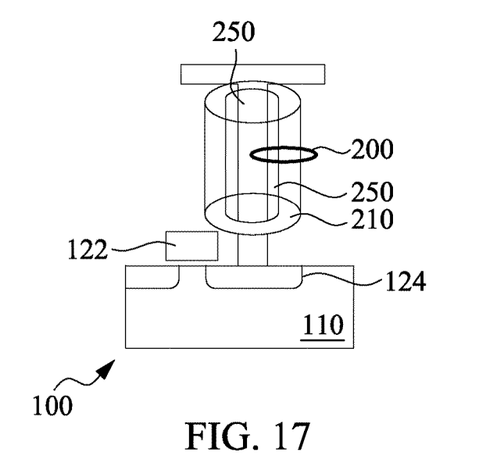

FIG. 17 illustrates a cylinder type structure connected to a source/drain region 124 adjacent to a gate 122 and over a substrate 110 with an FTJ structure 200 including a semiconducting or conductive electrode 210, an interfacial layer and a ferroelectric material layer (collectively illustrated and identified by reference number 235), and a composite electrode 250.

Figure 18:
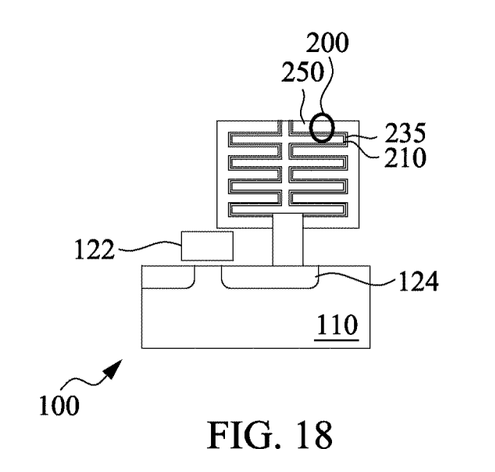

FIG. 18 illustrates a finger type structure connected to a source/drain region 124 adjacent to a gate 122 and over a substrate 110 with an FTJ structure 200 including a semiconducting or conductive electrode 210, an interfacial layer and a ferroelectric material layer (collectively illustrated and identified by reference number 235), and a composite electrode 250.

In each of the structures of FIGS. 15-18, the effective area of the FTJ cell 200 is increased as compared to a two-dimensional layout, thus increasing tunneling current.

Figure 19:
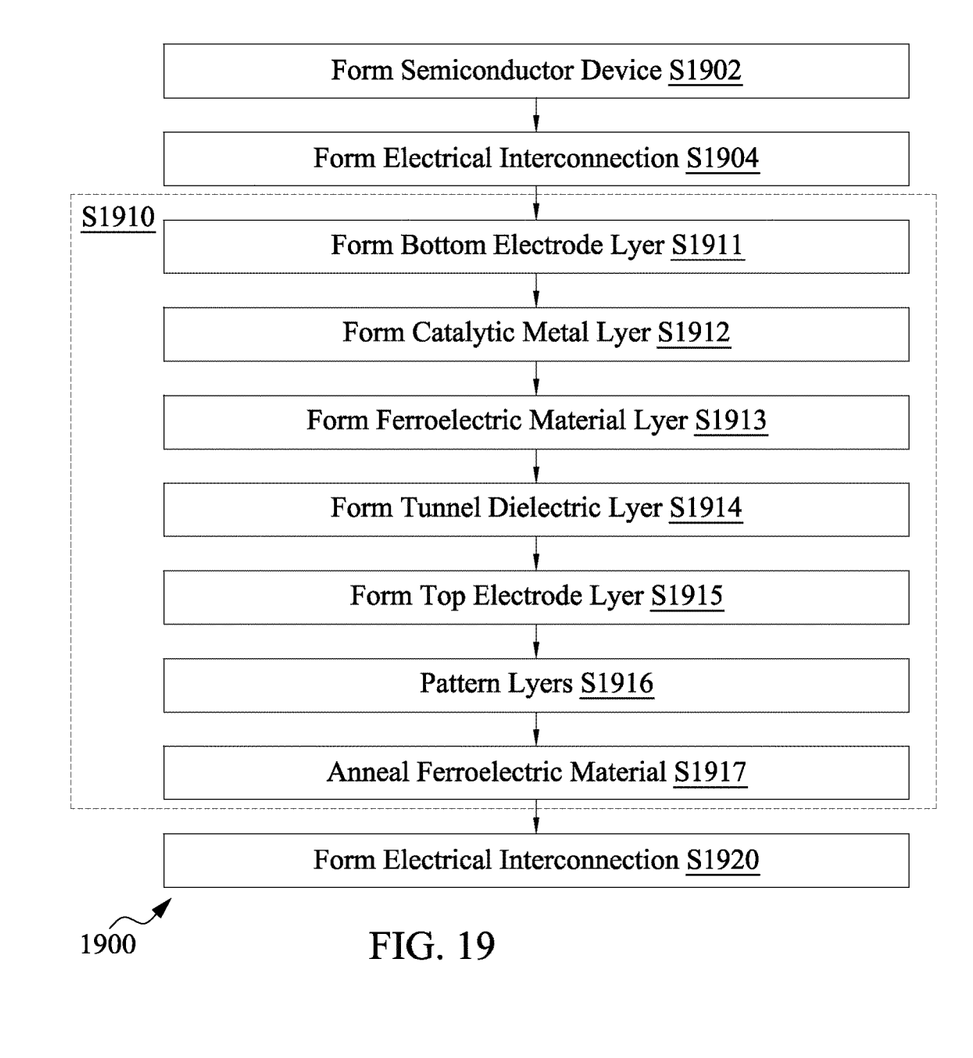
FIG. 19 is a flow chart illustrating a method, in accordance with some embodiments.

Referring now to FIG. 19, a method 1900 for fabricating a semiconductor device is illustrated.

Cross-referencing FIG. 19 and FIG. 2, method 1900 includes at operation S1902 forming in device layer 120 semiconductor devices 128 such as metal-oxide-semiconductor field effect transistors (MOSFETs) embedded in a dielectric layer 121 on the substrate 110. In some embodiments, the MOSFETs include NMOS and PMOS formed following the complementary MOS (CMOS) processes. In certain embodiments, the semiconductor devices 128 are formed by the front-end-of-line (FEOL) processes and may be considered as FEOL devices. In some embodiments, the formation of the semiconductor device 128 includes forming a gate structure 122 located on the substrate 110 and between source and drain regions 124 formed as doped regions in the substrate 110. In addition, the dielectric layer 121 is formed over the substrate 100 covering the gate structure 122 and conductive vias 126 are formed on the source and drain regions 124 penetrating through the dielectric layer 121. In some embodiments, a channel region 112 extends between the source and drain regions 124. In some embodiments, the device layer 120 further includes, but is not limited thereto, other types of transistors, capacitors, resistors, or the like. In some embodiments, the gate structure 122 includes a gate electrode and a gate dielectric layer.

In some embodiments, the dielectric layer 121 in the device layer 120 may be referred as interlayer dielectric (ILD) layer. In some embodiments, the material of the dielectric layer 121 includes silicon oxide, silicon nitride, silicon oxynitride, phosphosilicate glass (PSG), borosilicate glass (BSG), boron-doped phosphosilicate glass (BPSG), or low-k materials. The dielectric layer 121 may be formed by any acceptable deposition process, such as spin coating, chemical vapor deposition (CVD), or other suitable methods.

Method 1900 further includes, at operation S1904, forming an electrical interconnection to the devices 128 by forming an insulating layer 136 on the device layer 120, forming conductive vias 132 in the insulating layer 136, and forming conductive lines 134 on the insulating layer 136. The semiconductor device 128 of the device layer 120 electrically connects to the conductive lines 134 through the conductive vias 126, 132. In one embodiment, the conductive vias 132 and the conductive lines 134 are parts of the interconnection structure 130. In some embodiments, the material of the conductive vias 126, 132 and the conductive lines 134 may include a metal, such as copper, titanium, tungsten, aluminum, or a combination thereof. The conductive vias 126, 132 and the conductive lines 134 may be formed by CVD or plating. In some embodiments, the insulating layer 136 may be referred to as an interlayer dielectric (ILD) layer, and the material of the insulating layer 136 includes silicon oxide, silicon nitride, silicon oxynitride, or one or more low-k dielectric materials. In some embodiments, the insulating layer 136 is formed by CVD, spin-on coating, or other suitable methods. In some embodiments, the formation of the interconnection structure 130 includes the processes for forming one or more insulating layers and forming metal patterns in alternation and uses the back-end-of-line processes.

In some embodiments, such as FIG. 2, the gate structure 122 and the source and drain structures 124 of the semiconductor devices 128 are electrically connected to the conductive lines 134 at the same level of the metallization layer(s) of the interconnection structure 130. In some embodiments, the number of levels of the metallization layers in the interconnection structure 130 may be more than one, and the gate structure 122 and the source and drain structures 124 may connect to conductive lines 134 at different levels of the metallization layer.

Operation S1904 may further include forming a dielectric layer 161 and metallization structures including conductive vias 166, conductive lines 168 and conductive via 172. In some embodiments, multiple layers of dielectric pattern (not shown) are formed over the transistor layer 160 and the metallization structures including the conductive vias 166, the conductive lines 168 and the conductive via 172 are sequentially formed in the openings of different layers of the dielectric patterns. In some embodiments, one ends of the conductive vias 166 are formed on and connected with the source and drain regions 124 of the transistor 128 and the other ends of the conductive vias 166 are connected to the conductive lines 168. In some embodiments, the conductive via 172 is formed on and connected to the conductive lines 168. In some embodiments, the conductive vias 166, conductive lines 168 and conductive via 172 are embedded in the dielectric layer 161 with the top surface of the conductive via 172 exposed from the dielectric layer 161. In some embodiments, the number, pattern or configuration of the metallization structures are not limited to the drawings and may be modified depending on product designs.

In some embodiments, the material(s) of the metallization structures, such as the conductive vias 166 and 172 and the conductive lines 168, includes a metal, such as copper, titanium, tungsten, aluminum, or a combination thereof. The metallization structures may be formed by CVD or plating. In some embodiments, the material of the dielectric layer 161 includes silicon oxide, silicon nitride, silicon oxynitride, or one or more low-k dielectric materials. In some embodiments, the dielectric layer 161 is formed by CVD, spin-on coating, or other suitable methods.

Method 1900 further includes, at operation S1910, forming a memory cell device 200 on the dielectric layer 161 and covering the exposed conductive via 172. In some embodiments, the stacked layers of the memory cell device 200 may be sequentially and blanketly formed over the dielectric layer 161. Therefore, the layers are patterned into the FTJ stack.

For example, operation S1910 may include forming a bottom electrode layer over the dielectric layer 161 at operation S1911. Operation S1910 may include forming a catalytic metal layer over the bottom electrode layer at operation S1912. Operation S1910 may include forming a ferroelectric material layer over the bottom electrode layer at operation S1913. Operation S1910 may include forming a tunnel dielectric layer over the bottom electrode layer at operation S1914. Operation S1910 may include forming a top electrode layer over the bottom electrode layer at operation S1915. Operation S1910 may further include patterning the deposited layers at operation S1916. Operation S1910 may further include annealing the ferroelectric material layer at a temperature no more than 400° C. at operation S1917, such as at a temperature of no more than 395° C., no more than 390° C., no more than 385° C., or no more than 380° C., in certain embodiments.

As noted above, there are embodiments in which a semiconducting bottom electrode serves as both the bottom electrode and the tunnel dielectric. Further, there are embodiments in which the catalytic metal serves as both the catalytic metal layer and the top electrode. Thus, some of operations S1911-S1915 may be considered to be performed simultaneously or as substitutes for each other. Also, the order of operations S1911-S1917 may vary depending on the desired design of the FTJ structure.

As noted in conjunction with FIGS. 3, 10, and 11, various embodiments of the FTJ structure are contemplated. In certain embodiments, the structure of the ferroelectric tunnel junction (FTJ) includes at least one ferroelectric layer and a catalytic metal layer. For example, the FTJ may be a tunnel junction in which two metal electrodes are separated by a thin ferroelectric layer in contact with a catalytic metal. The spontaneous polarization of the ferroelectric layer can be switched by an applied electric field.

An exemplary FTJ structure has two or more states with different electric resistance values. Each state may represent a different digital value. The FTJ structure 200 may switch from one state to another by applying a predetermined voltage or current to the FTJ structure 200. For example, the FTJ structure 200 has a state of relatively high resistance, referred to as "a high resistance state", and a state of relatively low resistance, referred to as "a low resistance state". The FTJ structure 200 may be switched from the high resistance state to the low resistance state, or from the low resistance state to high resistance state by applying a predetermined voltage or current.

The transistor 128 and the FTJ structure may together form a FeRAM device 190. In some embodiments, the bottom electrode 210 is formed on the dielectric layer 161 and connects with the conductive via 172. In some embodiments, the bottom electrode 210 is electrically connected to one of the source and drain regions 124 of the transistor 128. In one embodiment, the bottom electrode 210 may further include a barrier layer formed on the dielectric layer 161. In some embodiments, the material of the bottom electrode 210 or the top electrode 250 may include one or more of copper (Cu), tantalum (Ta), tungsten (W), gold (Au), platinum (Pt), ruthenium (Ru), iridium (Ir), titanium (Ti), aluminum (Al), alloys thereof, or oxide, nitride, carbide, or silicide thereof. In some embodiments, the material of the bottom electrode 210 or the top electrode 250 includes indium-tin oxide (ITO). In some embodiments, the material of the bottom electrode 210 or the top electrode 250 may include TaN, TiN, TiAlN, TiW or combinations thereof. The thickness of the bottom electrode 210 or the top electrode 250 may be between a range about 5 nm to about 500 nm. In some embodiments, the bottom electrode 210 or the top electrode 250 is formed by CVD, ALD, PVD or other suitable methods.

Method 1900 may further include, at operation S1920, forming an interconnection over the FTJ structure 200 by forming a dielectric layer 171 over the dielectric layer 161 and enclosing the FTJ structure 200. The materials and the forming process of the dielectric layer 171 are similar to the materials and the forming process of the dielectric layer 161, therefore the details are not repeated herein. Operation S1920 may further include forming more metallization structures including conductive vias 184 and 186 and conductive lines 188 in the dielectric layers 161 and 171. For example, via holes and openings are formed in the dielectric layers 161 and 171 and conductive vias 184 and 186 and conductive lines 188 are later formed within the via holes and openings. In some embodiments, the top electrode layer 250 of the FTJ structure 200 is connected with the conductive via 184 and conductive line 188, and the bottom electrode 210 is connected with the conductive via 172 and further electrically connected with the below transistor 128 through the conductive lines 168 and conductive via 166.

In some embodiments, the formation of the metallization structures uses the back-end-of-line (BEOL) processes. In some embodiments, similar to the back-end-of-line processes for forming the interconnection structure 130, the metallization structures formed in the dielectric layers 161 and 171 may be considered as part of BEOL interconnecting structures.

Further, the memory cell is fabricated by the back-end-of-line (BEOL) processes and may be considered as a BEOL-compatible memory device.

A ferroelectric tunnel junction (FTJ) structure is provided in accordance with some embodiments. The FTJ structure includes a first electrode; a ferroelectric material layer; and a catalytic metal layer in contact with the ferroelectric material layer.

In exemplary embodiments of the FTJ structure, the catalytic metal layer comprising a catalytic metal having an electronegativity of no more than 1.8.

In exemplary embodiments of the FTJ structure, the ferroelectric material layer has a thickness of no more than 4 nanometers (nm).

In exemplary embodiments of the FTJ structure, the catalytic metal layer is a second electrode.

In such embodiments, the ferroelectric tunnel junction (FTJ) structure may consist of the first electrode, the ferroelectric material layer, and the catalytic metal layer.

Further, in such embodiments, the first electrode is a semiconducting layer.

In exemplary embodiments, the FTJ structure, further includes a second electrode. In such embodiments, the first electrode may be a semiconducting layer and the second electrode may be conductive.

In exemplary embodiments, the FTJ structure, further includes a non-polar oxide layer and a second electrode, and the ferroelectric material layer is a polar oxide layer. In such embodiments, the first electrode may be conductive and comprise a pure metal, a refractory metal nitride, or a conductive oxide, and the second electrode may be conductive and comprise a pure metal, a refractory metal nitride, or a conductive oxide, and the first electrode and the second electrode may be a same material or different materials; the polar oxide layer may comprise a ferroelectric material selected from perovskite, rutile or orthorhombic film; the non-polar oxide layer may comprise a dielectric oxide with dielectric constant greater than 3; and the catalytic metal layer may comprise a catalytic metal having an electronegativity of no more than 1.8.

A memory device is provided in accordance with some embodiments. The memory device includes a first electrode; at least one oxide layer located over the first electrode; and a catalytic metal located over the first electrode.

In exemplary embodiments of the memory device, the at least one oxide layer comprises a polar oxide layer and a non-polar oxide layer. In such embodiments, the memory device may further include a second electrode, and the first electrode and the second electrode may be conductive.

In exemplary embodiments of the memory device, the first electrode is a semiconducting layer comprised of amorphous, polycrystalline, or single crystalline material.

In exemplary embodiments of the memory device, the catalytic metal forms a second electrode, and the first electrode is a semiconducting layer.

In exemplary embodiments, the memory device, further includes a second electrode, the catalytic metal contacts the second electrode, and the first electrode is a semiconducting layer.

A method is provided in accordance with some embodiments. The method includes forming a catalytic metal layer in contact with a ferroelectric material layer, wherein the ferroelectric material layer has a thickness of no more than 4 nanometers (nm); and annealing the catalytic metal layer and the ferroelectric material layer at a temperature of no more than 400° C.

In exemplary embodiments, the method further includes forming a bottom electrode, wherein the catalytic metal layer and the ferroelectric material layer are formed over the bottom electrode. In such embodiments, the bottom electrode is a semiconducting layer.

In exemplary embodiments, the method further includes forming a top electrode over the catalytic metal layer and the ferroelectric material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A ferroelectric tunnel junction (FTJ) structure comprising:
   a first electrode;
   a ferroelectric material layer; and
   a catalytic metal layer in contact with the ferroelectric material layer.

2. The ferroelectric tunnel junction (FTJ) structure of claim 1, wherein the catalytic metal layer comprising a catalytic metal having an electronegativity of no more than 1.8.

3. The ferroelectric tunnel junction (FTJ) structure of claim 1, wherein the ferroelectric material layer has a thickness of no more than 4 nanometers (nm).

4. The ferroelectric tunnel junction (FTJ) structure of claim 1, wherein the catalytic metal layer is a second electrode.

5. The ferroelectric tunnel junction (FTJ) structure of claim 4, wherein the ferroelectric tunnel junction (FTJ) structure consists of the first electrode, the ferroelectric material layer, and the catalytic metal layer.

6. The ferroelectric tunnel junction (FTJ) structure of claim 1, further comprising a non-polar oxide layer and a second electrode, wherein the ferroelectric material layer is a polar oxide layer.

7. The ferroelectric tunnel junction (FTJ) structure of claim 6, wherein:
the first electrode is conductive and comprises a pure metal, a refractory metal nitride, or a conductive oxide;
the second electrode is conductive and comprises a pure metal, a refractory metal nitride, or a conductive oxide, wherein the first electrode and the second electrode comprise a same material or different materials;
the polar oxide layer comprises a ferroelectric material selected from perovskite, rutile or orthorhombic film;
the non-polar oxide layer comprises a dielectric oxide with dielectric constant greater than 3; and
the catalytic metal layer comprises a catalytic metal having an electronegativity of no more than 1.8.

8. The ferroelectric tunnel junction (FTJ) structure of claim 1, wherein the catalytic metal layer comprising a catalytic metal has an electronegativity of no more than 1.8, and wherein the ferroelectric material layer has a thickness of no more than 4 nanometers (nm).

9. The ferroelectric tunnel junction (FTJ) structure of claim 1, wherein the catalytic metal layer enables crystallization of the ferroelectric material layer at a temperature of no more than 400° C.

10. The ferroelectric tunnel junction (FTJ) structure of claim 1, wherein the catalytic metal layer provides metal-induced crystallization of the ferroelectric material layer.

11. The ferroelectric tunnel junction (FTJ) structure of claim 1, wherein the catalytic metal layer reduces a crystallization temperature of the ferroelectric material layer for back-end-of-line (BEOL) thermal budget compatibility.

12. The ferroelectric tunnel junction (FTJ) structure of claim 1, wherein the ferroelectric material layer has a thickness of no more than 4 nanometers, and wherein the catalytic metal layer comprises at least one of tungsten, molybdenum, tantalum, or hafnium.

13. The ferroelectric tunnel junction (FTJ) structure of claim 1, wherein:
the catalytic metal layer is in direct contact with the ferroelectric material layer;
the catalytic metal layer has a thickness of 0.5 to 10 angstroms; and
the ferroelectric material layer comprises $HfO_2$, $HfZrO_2$, or $HfO_2$ doped with silicon, germanium, lanthanum, aluminum, yttrium, strontium or zirconium.

14. A ferroelectric tunnel junction (FTJ) structure comprising:
a semiconducting layer;
a catalytic metal layer in contact with the semiconducting layer;
a ferroelectric material layer in contact with the catalytic metal layer, wherein the ferroelectric material layer is a polar oxide layer; and
a non-polar oxide layer in contact with the ferroelectric material layer.

15. A ferroelectric tunnel junction (FTJ) structure consisting of:
a first electrode;
a ferroelectric material layer; and
a catalytic metal layer in contact with the ferroelectric material layer, wherein the catalytic metal layer is a second electrode.

16. The ferroelectric tunnel junction (FTJ) structure of claim 15, wherein the catalytic metal layer is tungsten, molybdenum, tantalum, or hafnium.

17. The ferroelectric tunnel junction (FTJ) structure of claim 15, wherein the catalytic metal layer is tungsten.

18. The ferroelectric tunnel junction (FTJ) structure of claim 15, wherein the catalytic metal layer is molybdenum.

19. The ferroelectric tunnel junction (FTJ) structure of claim 15, wherein the catalytic metal layer is tantalum.

20. The ferroelectric tunnel junction (FTJ) structure of claim 15, wherein the catalytic metal layer is hafnium.

* * * * *